(12) United States Patent
Goda et al.

(10) Patent No.: US 7,916,543 B2
(45) Date of Patent: Mar. 29, 2011

(54) MEMORY CELL OPERATION

(75) Inventors: Akira Goda, Boise, ID (US); Seiichi Aritome, Zhudong (TW)

(73) Assignee: Micron Technology, Inc., Boise, ID (US)

( * ) Notice: Subject to any disclaimer, the term of this patent is extended or adjusted under 35 U.S.C. 154(b) by 71 days.

(21) Appl. No.: 11/876,406

(22) Filed: Oct. 22, 2007

(65) Prior Publication Data
US 2009/0103371 A1  Apr. 23, 2009

(51) Int. Cl.
*G11C 11/34* (2006.01)
(52) U.S. Cl. ......... 365/185.17; 365/185.18; 365/185.19; 365/185.22; 365/185.29; 365/185.33
(58) Field of Classification Search ............ 365/185.03, 365/185.11, 185.14, 185.17, 185.18, 185.19, 365/185.21, 185.22, 185.29, 185.3, 185.33
See application file for complete search history.

(56) References Cited

U.S. PATENT DOCUMENTS

| | | | |
|---|---|---|---|
| 5,467,309 A * | 11/1995 | Tanaka et al. ............ 365/185.14 |
| 6,115,291 A | 9/2000 | Lakhani | |
| 6,252,803 B1 | 6/2001 | Fastow | |
| 6,288,944 B1 | 9/2001 | Kawamura | |
| 6,345,001 B1 | 2/2002 | Mokhlesi | |
| 6,381,550 B1 * | 4/2002 | Hsia et al. ............... 365/185.11 |
| 6,385,090 B1 * | 5/2002 | Kitazaki ................. 365/185.18 |
| 6,483,751 B2 * | 11/2002 | Chen et al. .............. 365/185.33 |
| 6,493,280 B2 | 12/2002 | Mihnea et al. | |
| 6,542,410 B2 * | 4/2003 | Hirano ....................... 365/185.3 |
| 6,643,187 B2 | 11/2003 | Mokhlesi | |
| 6,654,292 B2 * | 11/2003 | Keays ..................... 365/185.33 |
| 6,798,699 B2 | 9/2004 | Mihnea et al. | |
| 6,807,101 B2 * | 10/2004 | Ooishi et al. ............ 365/185.21 |
| 6,831,865 B2 | 12/2004 | Chang et al. | |
| 6,903,974 B2 * | 6/2005 | Wooldridge ............ 365/185.22 |
| 6,907,497 B2 | 6/2005 | Hosono et al. | |
| 7,035,967 B2 | 4/2006 | Chang et al. | |
| 7,099,220 B2 | 8/2006 | Mihnea et al. | |
| 7,149,121 B2 | 12/2006 | Lin et al. | |
| 7,180,781 B2 * | 2/2007 | Abedifard et al. ....... 365/185.19 |
| 7,221,593 B2 * | 5/2007 | Roohparvar ........... 365/185.19 |
| 7,224,604 B2 | 5/2007 | Lasser | |
| 7,679,961 B2 * | 3/2010 | Lee et al. ................. 365/185.29 |
| 2005/0219896 A1 | 10/2005 | Chen et al. | |

* cited by examiner

*Primary Examiner* — Trong Phan
(74) *Attorney, Agent, or Firm* — Brooks, Cameron & Huebsch, PLLC

(57) ABSTRACT

Embodiments of the present disclosure provide methods, devices, modules, and systems for programming memory cells. One method includes determining a quantity of erase pulses used to place a group of memory cells of the array in an erased state, and adjusting at least one operating parameter associated with programming the group of memory cells at least partially based on the determined quantity of erase pulses.

9 Claims, 9 Drawing Sheets

| Quantity of Erase Pulses (or Verase_max) | Vpgm_start | Vstep | Pgm Verify | Vpass |
|---|---|---|---|---|
| <X | Vpgms | Vstep | PV | Vpass |
| X~Y | Vpgms -200mV | Vstep -100mV | PV +50mV | Vpass -300mV |
| >Y | Vpgms -400mV | Vstep -200mV | PV +100mV | Vpass -600mV |

Fig. 9A

| Quantity of Erase Pulses (or Verase_max) | Vpgm_start | Vstep | Pgm Verify | Vpass |
|---|---|---|---|---|
| <X | Vpgms | Vstep | PV | Vpass |
| X~Y | Vpgms -200mV | Vstep | PV | Vpass -300mV |
| >Y | Vpgms -400mV | Vstep | PV | Vpass -600mV |

Fig. 9B

| | ERASE | ERASE VERIFY | PROGRAM (WL-0) | READ (WL-0) |
|---|---|---|---|---|
| BL | FLOATING | 0 V | 0 V/Vcc | 1.0 V |
| SGD | FLOATING | 3.5 V | Vcc→1.0 V | (3.5 V) Vpass-read |
| WL-31 | 0 V | 0 V | Vpass (10V) | Vpass-read |
| WL-30 | 0 V | 0 V | Vpass | Vpass-read |
| WL-29 | 0 V | 0 V | Vpass | Vpass-read |
| WL-1 | 0 V | 0 V | Vpass | Vpass-read |
| WL-0 | 0 V | 0 V | Vpgm | Vread |
| SGS | FLOATING | 3.5 V | 0 V | 3.5 V |
| SOURCE | FLOATING | 1.5 V | Vcc | 0 V |
| P-well (+N-well) | Vera=20 V | 0 V | 0 V | 0 V |

Fig. 10

MEMORY CELL OPERATION

TECHNICAL FIELD

The present disclosure relates generally to semiconductor devices and, more particularly, to memory devices having memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices typically use a one-transistor memory cell that allows for high memory densities, high reliability, and low power consumption. Flash memory devices are utilized as non-volatile memory for a wide range of electronic applications, including personal computers, personal digital assistants (PDAs), digital cameras, and cellular telephones, among others. Program code and system data, such as a basic input/output system (BIOS) which can be used in personal computing systems, are typically stored in flash memory devices.

Flash memories, comprised of a number of strings formed of one or more memory cells, are typically arranged into array architectures, e.g., a matrix. Two common types of flash memory array architectures are the "NAND" and the "NOR" architectures.

In the NOR array architecture, the floating gate memory cells of the memory array are typically arranged in a matrix. The NOR architecture floating gate memory array is accessed using a row decoder to activate a row of floating gate memory cells by selecting a select line coupled to their gates. The data values of the row of selected memory cells are then placed on sense lines, a data value being indicated by the flow of current corresponding to a particular cell being in a programmed state or an erased state.

A NAND architecture also has its array of floating gate memory cells arranged in a matrix such that the control gates of each floating gate memory cell transistor of the array are typically coupled in rows by select lines. However, each memory cell is not independently coupled to a sense line. Instead, the memory cells are electrically coupled together in series, source to drain, between a source line and a sense line, i.e., which is sometimes referred to as bit line, with the drain terminal for each transistor in a string being oriented towards the sense line.

The NAND architecture memory array is also accessed using a row decoder activating a row of memory cells by selecting a select line, e.g., row select, which is sometimes referred to as a word line, coupled to their gates. A high bias voltage is applied to a selected gate's drain line SG(D). The word lines coupled to the gates of unselected memory cells of each string are driven, e.g., at Vpass, to operate the unselected memory cells of each group as pass transistors so that they pass current in a manner that is unrestricted by their stored data values. In this manner, a selected transistor is tested for its ability to conduct current, which flows through each group of series-coupled transistors, restricted only by the selected memory cells of each string, thereby placing the current encoded data values of the row of selected memory cells on the sense lines.

Memory cells in a NAND array architecture can be programmed to a desired state. That is, electric charge can be placed on, or removed from, the floating gate of a memory cell to put the cell into any of a number of stored states. For example, a single level cell (SLC) can represent two states, e.g., a 1 or 0 state, such as to indicate a binary digit ("bit"). Flash memory multi state memory cells, multibit cells, or multi-level cells which are referred to generically hereinafter, both in the specification and the claims, as multi-level cells (MLCs), can be programmed into more than two possible binary states. MLCs allow the manufacture of higher density memories without increasing the number of memory cells since each cell can represent more than one bit. MLCs can have more than one programmed state and one erase state, e.g., a cell capable of representing four bits can have fifteen programmed states and an erased state, e.g., 1111, 0111, 0011, 1011, 1001, 0001, 0101, 1101, 1100, 0100, 1110, 1000, 1010, 0010, 0110, and 0000.

MLC memory stores multiple bits on each cell by using different threshold voltage (Vt) levels for each state that is stored. The difference between adjacent Vt distribution levels may be very small for a MLC memory device as compared to a SLC memory device. The reduced margins between adjacent Vt levels, e.g., representing different program states, can increase the difficulty associated with distinguishing between adjacent program states, which can lead to problems such as reduced data read and/or data retrieval reliability.

In a NAND array architecture, the state of a selected memory cell is determined by sensing a current or voltage variation associated with a particular sense line to which the selected cell is coupled. Since the memory cells are connected in series, the current associated with reading the selected cell passes through several other unselected cells, e.g., cells biased so as to be in a conductive state, coupled to the sense line. Various degradation mechanisms exist which can result in erroneous data reads of non-volatile memory cells. The cell current associated with a string of memory cells, e.g., cells coupled in series between a source line and a sense line, can become degraded over time. Memory cells affected by current degradation mechanisms can become unreliable, e.g., the logical value read from the cells may not necessarily be the logical value written to the cells.

Program/erase cycling is one factor which can affect memory cell performance. Cycle endurance of a memory cell is dependent on the difference in a cell's threshold voltage, $V_T$, between the programmed state and the erased state. As the number of program/erase cycles increases, i.e., cycle endurance, cell current can decrease in some memory cells, resulting in subsequent data read errors. Increasing program/erase cycling is also associated with changes in memory performance, e.g., programming speed decreases and erase speed increases, as well as other changes in operational attributes. Slower programming speed may make the affected cells more susceptible to over-programming. For instance, when a voltage is applied to a particular cell, the conditioning of the cell may cause the cell to be over charged, thereby causing further cell degradation and an incorrect result when read and/or verified.

BRIEF DESCRIPTION OF THE DRAWINGS

FIG. 9A illustrates a table of operating voltages that can be used in accordance with one or more embodiments of the present disclosure.

FIG. 9B illustrates a table of operating voltages that can be used in accordance with one or more embodiments of the present disclosure.

FIG. 10 illustrates a table of operating voltages that can be used in accordance with one or more embodiments of the present disclosure.

DETAILED DESCRIPTION

Embodiments of the present disclosure provide methods, devices, modules, and systems for programming non-volatile memory cells. One method includes determining a quantity of erase pulses used to place a group of memory cells of the array in an erased state, and adjusting at least one operating parameter associated with programming the group of memory cells at least partially based on the determined quantity of erase pulses.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

Hereinafter, the terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation.

Figure 1:
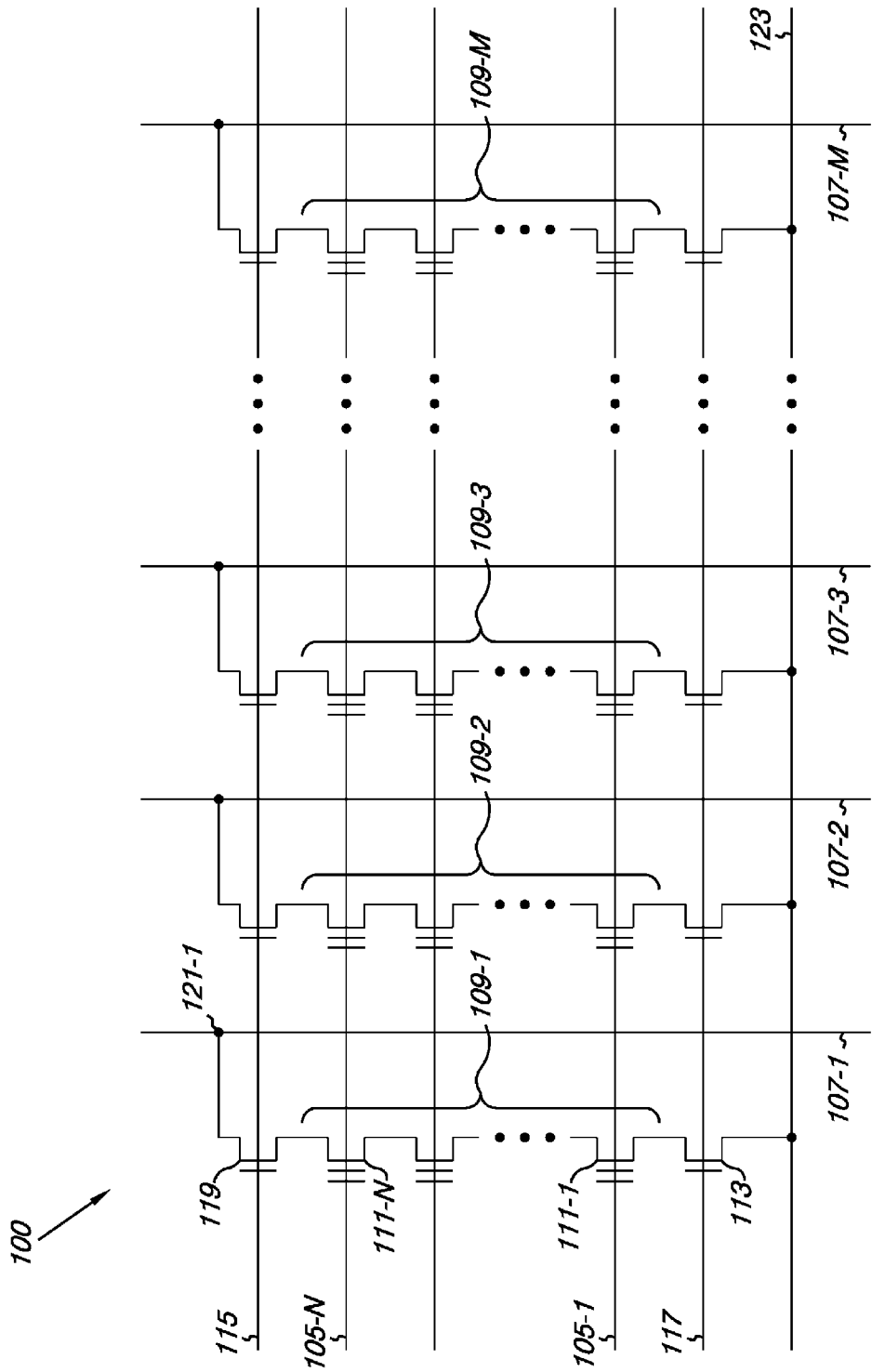
FIG. 1 is a schematic of a portion of a non-volatile memory array that can be used with embodiments of the present disclosure.

FIG. 1 is a schematic of a portion of a non-volatile memory array 100 that can be used with one or more embodiments of the present disclosure. The embodiment of FIG. 1 illustrates a NAND architecture non-volatile memory. However, embodiments described herein are not limited to this example. In one or more embodiments, the array 100 includes a number of multilevel memory cells (MLCs).

As shown in FIG. 1, the memory array 100 includes row-select lines 105-1, . . . , 105-N and intersecting sense lines 107-1, 107-2, 107-3, . . . , 107-M. The indicators "M" and "N" are used to indicate that the array 100 can include a number of row-select lines and a number of sense lines. For ease of addressing in the digital environment, the number of row-select lines 105-1, . . . , 105-N and the number of sense lines 107-1, 107-2, 107-3, . . . , 107-M are usually each some power of two, e.g., 256 row-select lines by 4,096 sense lines.

Memory array 100 includes NAND strings 109-1, 109-2, 109-3, . . . , 109-M. Each NAND string includes non-volatile memory cells 111-1, . . . , 111-N, each located at an intersection of a row-select line 105-1, . . . , 105-N and a local sense line 107-1, 107-2, 107-3, . . . , 107-M. The non-volatile memory cells 111-1, . . . , 111-N of each NAND string 109-1, 109-2, 109-3, . . . , 109-M are connected in series, source to drain between a select gate source (SGS) transistor, e.g., a field-effect transistor (FET) 113, and a select gate drain (SGD) transistor, e.g., FET 119. Source select gate 113 is located at the intersection of a local sense line 107-1 and a source select line 117, while drain select gate 119 is located at the intersection of a local sense line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local sense line 107-1 for the corresponding NAND string 109-1 at drain contact 121-1. The source of drain select gate 119 is connected to the drain of the last memory cell 111-N, e.g. floating-gate transistor, of the corresponding NAND string 109-1.

In one or more embodiments, construction of non-volatile memory cells 111-1, . . . , 111-N includes a source, a drain, a floating gate or other charge storage layer node, and a control gate. Non-volatile memory cells, 111-1, . . . , 111-N, have their control gates coupled to an associated row-select line, 105-1, . . . , 105-N, respectively. Thus, a row of the non-volatile memory cells are commonly coupled to a given row-select line, e.g., 105-1, . . . , 105-N. A column of the non-volatile memory cells 111-1, . . . , 111-N make up the NAND strings, e.g., 109-1, 109-2, 109-3, . . . , 109-M, coupled to a given local sense line, e.g., 107-1, 107-2, 107-3, . . . , 107-M, respectively. A NOR array architecture would be similarly laid out with the exception that the string of memory cells would be coupled in parallel between the select gates.

As will be described further below in connection with subsequent figures, various aspects of memory cell operational performance change as the quantity of program/erase cycles increase, e.g., current degradation, programming speed, etc. The present inventors appreciate that performance changes suggest adjustments be made of operating parameters, e.g., voltages, associated with programming for an array of non-volatile memory cells, e.g., array 100, as a means for extending its useful life. Adjustments can include measures to counteract degradation, and/or to adapt to new performance characteristics. For example, a healing operation can be used to extract trapped electron charge in an attempt to counteract degraded current performance, or the quantity of erase pulses used to place memory cells in an erased state can be increased in response to slower erase operations, or programming operations can be adjusted to accommodate new programming performance. Further discussion of memory cell operational performance changes is provided in co-pending, co-assigned U.S. patent application Ser. No. 11/414,966, entitled, "Memory Voltage Cycle Adjustment", filed on May 1, 2006, also having common inventorship, the specification being incorporated herein in full by reference.

Figure 2:
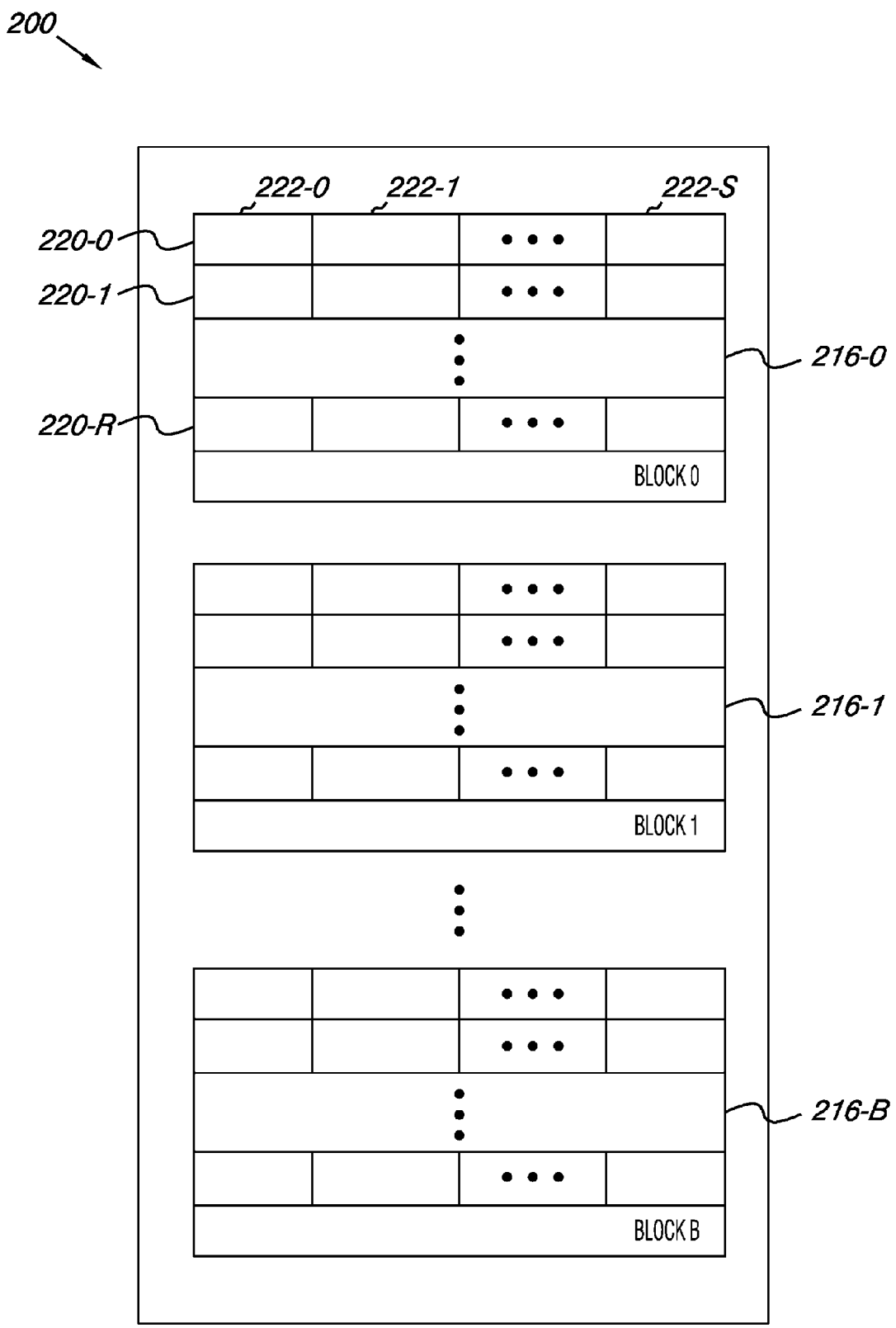
FIG. 2 illustrates a diagram of a memory array having a number of blocks that can be used with embodiments of the present disclosure.

FIG. 2 illustrates a diagram of a memory array 200 having a number of blocks 216-0 (BLOCK 0), 216-1 (BLOCK 1), . . . , 216-B (BLOCK B) that can be used with embodiments of the present disclosure. As an example, the number of memory blocks in array 200 may be 128 blocks, 512 blocks, or 1,024 blocks, but embodiments are not limited to a particular number of memory blocks in an array 200. In the embodiment illustrated in FIG. 2, the memory array 200 is, for example, a NAND flash memory array 200.

In one or more embodiments, the blocks 216-0, 216-1, . . . , 216-B are referred to as memory blocks or erase blocks. The indicator "B" is used to indicate that the array 200 can include a number of erase blocks. In such embodiments, the memory cells in each block 216-0, 216-1, . . . , 216-B can be erased together as a unit, e.g., the cells in each block are simultaneously erased. Each memory block, e.g., 216-0, 216-1, . . . , 216-B, contains a number of physical rows, e.g., 220-0, 220-1, . . . , 220-R, of memory cells coupled to a row-select line. The indicator "R" is used to indicate that a memory block, e.g., 216-0, 216-1, . . . , 216-B, can include a number of rows. In some embodiments, the number of rows, e.g., row-select lines, in each memory block can be 32, but embodiments are not limited to a particular number of rows 220-0, 220-1, . . . , 220-R, e.g., row-select lines, per block.

In one or more embodiments of the present disclosure, certain operations can be performed on a single block, i.e., on a block by block basis. In some embodiments, a programming operation is performed following some number of erase attempts performed on a single block, e.g., 216-0, 216-1, . . . , 216-B. The number of erase pulses used to accomplish an erase operation, e.g., place the memory cell(s) in an erased state, has correspondence with a number of program and/or erase cycles associated with a particular block. The number of program and/or erase cycles associated with a particular block is also referred to as a "hot count." Placing memory cells in an erased state includes erase verification, i.e., checking to ensure the memory cells operate as expected when erased, and if not, continuing to apply erase pulses until such operability is achieved.

In some embodiments of the present disclosure, certain operations are performed on each block within a group of blocks, e.g., 216-0, 216-1, . . . , 216-B, based on operating performance criteria common to the group of blocks, e.g., hot count or number or erase pulses used. In one or more embodiments of the present disclosure, certain operations are performed on multiple blocks, e.g., 216-0, 216-1, . . . , 216-B which can provide benefits such as reducing the time associated with performing operations as compared to operating on the group of blocks on a block by block basis.

As one of ordinary skill in the art will appreciate, each row 220-0, 220-1, . . . , 220-R can store one or more pages of data. A page refers to a unit of programming and/or reading, e.g., a number of cells that are programmed and/or read together or as a functional group of memory cells. In the embodiment shown in FIG. 2, each row 220-0, 220-1, . . . , 220-R stores one page of data. However, embodiments of the present invention are not so limited. For instance, in some embodiments of the present invention, each row can store multiple pages of data. In some embodiments of the present invention, each row can store one or more even pages of data associated with even-numbered sense lines, and one or more odd pages of data associated with odd-numbered sense lines.

In one or more embodiments of the present invention, and as shown in FIG. 2, a page associated with the rows 220-0, 220-1, . . . , 220-R can store data in accordance with a number of logical sectors 222-0, 222-1, . . . , 222-S of data. The indicator "S" is used to indicate that a row, e.g., 220-0, 220-1, . . . , 220-R, can include a number of sectors. Each logical sector 222-0, 222-1, . . . , 222-S can store information representing a number of bytes of data, e.g., 256 bytes, 512 bytes, or 1,024 bytes, but embodiments are not limited to a particular number of logical sectors per row, or bytes of data stored in a logical sector 222-0, 222-1, . . . , 222-S. It is noted that other formats and/or configurations for the blocks 216-0, 216-1, . . . , 216-B, rows 220-0, 220-1, . . . , 220-R, sectors 222-0, 222-1, . . . , 222-S, and pages are possible. For example, the rows 220-0, 220-1, . . . , 220-R of the memory blocks 216-0, 216-1, . . . , 216-B can include a single sector which can include, for example, more or less than 512 bytes of data.

Figure 3:
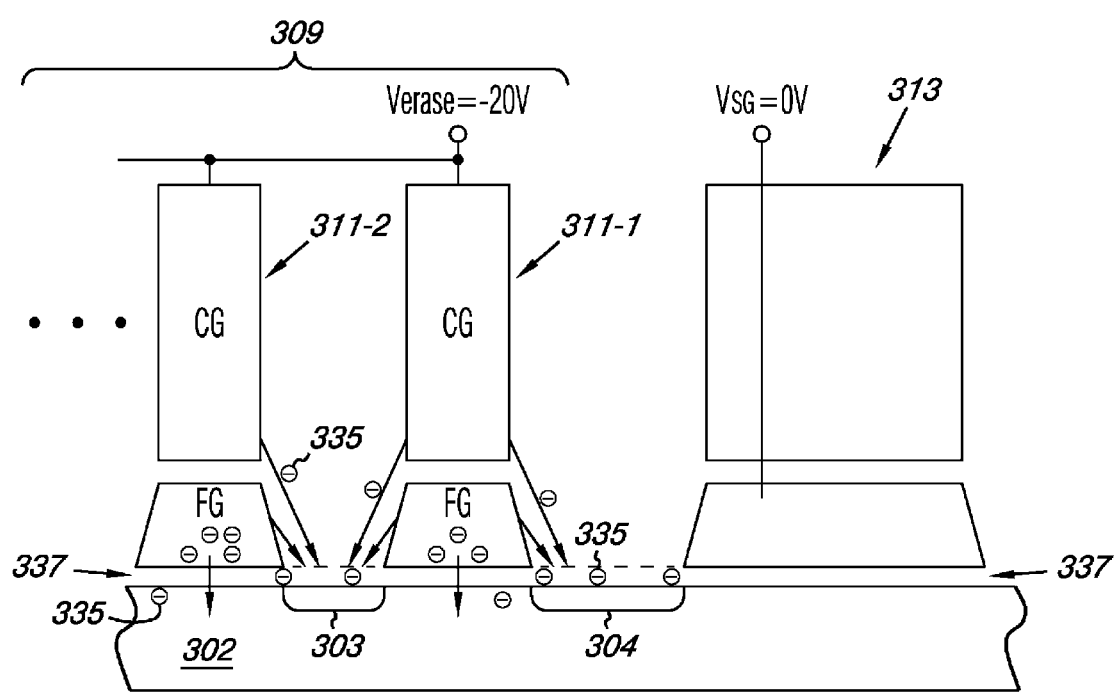
FIG. 3 illustrates a diagram of a portion of a string of non-volatile memory cells during an erase operation.

FIG. 3 illustrates a diagram of a portion of a string 309 of non-volatile memory cells during an erase operation according to an embodiment of the present disclosure, e.g., string 109-1, 109-2, 109-3, . . . , 109-M shown in FIG. 1. The discussion that follows provides an example of how a quantity of program/erase operation cycles can change memory cell performance characteristics. Eventually, additional erase pulses will be required to counteract the effects described below. In this manner, the quantity of erase pulses needed to erase a particular memory cell, or block of memory cells, reflects the quantity of program/erase cycles to which the particular memory cell, or block of memory cells, has been previously subjected.

As illustrated in FIG. 3, the string 309 is configured to be a NAND structure that includes a number of memory cells, e.g., 311-1 and 311-2, and a select gate transistor 313. In this embodiment, the memory cell 311-1 is an edge memory cell and the memory cell 311-2 is a non-edge memory cell, e.g., a cell which is not adjacent to a select gate transistor associated with the string. In this embodiment, the select gate transistor 313 is a source select gate transistor 313, e.g., a select gate transistor which couples the string 309 to a common source line, e.g., common source line 123 shown in FIG. 1.

As shown for the embodiment of the present disclosure illustrated in FIG. 3, the memory cells, e.g., 311-1 and 311-2, have a gate stack configuration including a control gate (CG) and a floating gate (FG) formed over a substrate 302. The substrate 302 is formed, for example, of a p-type silicon, and implanted with n-type diffusion regions, e.g., regions 303 and 304, that respectively act as the source and drain regions for the memory cells 311-1 and 311-2. The substrate 302 is referred to as the substrate body region, e.g., P-well region in this example. In one or more embodiments, the N-type diffusion regions 303 and 304 are lightly doped N-type, e.g., N-, diffusion regions. In some embodiments of the present invention, the substrate 302 is an n-type substrate implanted with P-type diffusion regions, e.g., regions 303 and 304, such that the substrate body is an N-well region.

As illustrated in FIG. 3, a dielectric layer 337 is formed on the substrate 302. The floating gates (FG) of memory cells 311-1 and 311-2 are formed over the dielectric layer 337. The dielectric layer 337 also extends between adjacent memory cell gate stacks, e.g., between memory cells 311-1 and 311-2, as well as between the edge cell 311-1 and the select gate 313. As used herein, an edge cell refers to a memory cell adjacent to a select gate, e.g., memory cell 111-1 of FIG. 1 is an edge cell adjacent to source select gate 113, and memory cell 111-N is an edge cell adjacent to drain select gate 119. The dielectric layer 337 resides above at least a portion of the diffusion regions 303 and 304. The dielectric layer 337 can be silicon dioxide or another dielectric material. In one or more embodiments, the dielectric layer 337 includes a number of layers of the same or different dielectric material(s) and can be located above and/or around the source/drain regions 303 and 304.

The diagram of FIG. 3 illustrates the string 309 during an erase operation. In this example, the erase operation includes applying a relatively high potential difference between the control gates of the memory cells 311-1 and 311-2, and the substrate 302 in order to remove charge, e.g., electrons, from the floating gates of the cells 311-1 and 311-2. In this example, Verase is −20V, e.g., 20V is applied to the substrate body 302 and 0V is applied to the control gates of the cells 311-1 and 311-2. The high voltage erase pulse is intended to induce electrons to move away from the floating gates of the memory cells, e.g., to move to the substrate active area 302.

However, as shown in FIG. 3, the biasing conditions applied to the string 309 during an erase operation can cause electrons from the floating gate to become trapped electrons 335 in portions of the dielectric layer(s), e.g., dielectric 337, located above the diffusion regions 303 and 304 between cell stacks 311-1 and 311-2, and between the edge cell stack 311-1 and the select gate 313. The trapping effect can be more pronounced at the edges of a string of memory cells, such as due to an increased lateral fringing field between the edge cell stack, e.g., 311-1, and a select gate, e.g., select gate 313. The relatively high potential difference during an erase operation between the edge cell stack 311-1 and the select gate 313 can result in more trapped electrons 335 in the portion of the dielectric layer(s) 337 between the edge cell stack 311-1 and select gate 313 than in the portions of the dielectric layer(s) 337 between adjacent cell stacks, e.g., between memory cell stacks 311-1 and 311-2. In the example shown in FIG. 3, the control gate of edge memory cell 311-1 is biased at −20V with respect to the select gate 313, which is biased at about 0V, e.g., a ground potential. As such, the lateral electric field between the edge cell stack 311-1 and the select gate 313 can cause electrons 335 to migrate from the control gate (CG) and/or floating gate (FG) of edge cell 311-1, to become trapped in the portion of the dielectric layer 337 above the diffusion region 304, between edge cell stack 311-1 and select gate 313.

In the embodiment illustrated in FIG. 3, the migration of electrons between edge cell 311-1 and select gate 313 are represent by the arrows shown, the electrons having a trajectory from the edge cell 311-1 towards the select gate 313, such as due to fringing field effects between a select gate 313 and an edge cell 311-1 stack during an erase operation. The arrows between edge cell stack 311-1 and select gate non-edge cell stack 311-2 represent the flow of electrons due to fringing field effects between adjacent cell stacks during an erase operation.

Through program/erase cycling, the trapped charge 335 can gradually accumulate between an edge cell stack, e.g., 311-1, and an adjacent select gate, e.g., select gate 313; and between adjacent memory cell stacks, e.g., 311-1 and 311-2. The accumulated trapped charge 335 can cause current degradation associated with a memory cell and/or a string of memory cells, e.g., string 309. That is, the build-up of charge 335 in the dielectric layer(s) 337 between cells and/or between an edge cell and a select gate, can result in a gradual reduction of current associated with reading cells in the string, e.g., string 309, by increasing the resistance associated with the diffusion regions, e.g., 303 and 304, between cells.

As one of ordinary skill in the art will appreciate, in a read operation performed on a selected memory cell in a NAND string, the unselected memory cells of the string are biased so as to be in a conducting state. An example of operating parameters, e.g., voltages, associated with a read operation is shown in FIG. 10 corresponding to an embodiment of the present invention. In such a read operation, the data stored in the selected cell can be based on the current and/or voltage sensed on the sense line corresponding to a particular string. For example, the logical value of data stored in a selected cell can be determined based on whether the sense line current changes by a particular amount, or reaches a particular level within a given time period.

When the selected cell is in a conductive state, current flows between the source line contact at one end of the string and a drain line contact at the other end of the string. As such, the current associated with reading the selected cell is carried through each of the other cells in the string, including the respective diffused regions between cell stacks, and the select transistors. Therefore, current reduction associated with each of the cells in the string, e.g., the diffused regions between cells and/or the select gates, can cumulatively reduce the current associated with reading a selected cell. Memory cells affected by current degradation can become unreliable due to the reduced current associated with the selected cell of the string. For instance, current reduction may be large enough to indicate a different logical data value when being read than the logical data value written to the cells.

In various devices and systems, program/erase operations can be performed on memory blocks. In some previous approaches the number of program/erase cycles performed on a memory block are stored within the memory array, e.g., memory array 100. The quantity of program/erase cycles performed on a memory block is referred to as an "experience count," or "hot count." The hot count of a memory array, and/or of each memory block within the memory array, can be monitored, for example by a controller implemented by control circuitry or logic instructions.

As the quantity of program/erase cycles increases, the voltage difference between the programmed state and the erased state narrows. This factor may help decrease the performance of the memory array, e.g., decrease programming speed. However, this factor also makes the affected cells more susceptible to over-programming as the separation between threshold voltages, $V_T$, narrows, resulting from the threshold voltage tending to increase as the quantity of program/erase cycles increase.

While memory cells may be programmed individually, memory cells are generally erased in groups, such as in blocks or other functional units as will be appreciated by those possessing ordinary skill in the art. One example of a process to erase a group of memory cells according to the present invention includes selecting the block of memory cells to be erased. The block of memory cells is erased by setting the erase voltage parameters, e.g., Verase magnitude, and issuing a quantity of erase pulses having the erase voltage parameters. Subsequently, a first erase verification is performed, to determine if the group of memory cells has been satisfactorily erased by the quantity of erase pulses issued thus far. If not, additional erase pulses are issued, with periodic erase verification being performed until satisfactory erasure to a particular first threshold is accomplished. Parameters of the erase pulses may be adjusted during the above-mentioned process, including but not limited to, adjusting the maximum erase voltage used.

Following accomplishment of satisfactory erasure to the particular first threshold, soft programming parameters, e.g., Vsoft_pgm, are set, and soft programming is issued to the group, e.g., block, of memory cells. Subsequent to issuing the soft programming, a second type of erase process verification is performed, e.g., to determine if the group of memory cells has been satisfactorily soft programmed to particular performance criteria. If not, additional soft programming is issued, with periodic verification being performed until satisfactory memory cell operation to a particular performance criteria is accomplished, e.g., indicating successful erasure completed.

Parameters of the soft programming signals may be adjusted before or during the above-mentioned soft programming process, including but not limited to, adjusting the soft programming voltage used. The specific adjustments made to the soft programming parameters may, for example, be at least partially on the quantity of erase pulses used, and/or from the maximum erase voltage used to erase the group of memory cells. In this regard, adjusting operating parameters, e.g., voltages, associated with programming includes those parameters used in processes involving erasing, and verification of erasing, and soft_programming, and soft programming verification, among others. Since erasing a group of memory cells is accomplished in preparation of subsequent new data storage operations, erase steps done in preparation for further programming are thereby associated with programming.

From the above-describe erasure process and/or soft programming process, the erase energy used to place the group of memory cells in an erased state can be determined, the erase energy used being, for example, a function of the quantity of program/erase cycles to which the group of memory cells has experienced. The erase energy is a function of the quantity and magnitude of erase pulses used to place the group of memory cells in an erased state. For example, fewer erase pulses of higher maximum erase voltage magnitude may be equivalent to more erase pulses of lower maximum erase voltage magnitude. Thus according to one or more embodiments of the present invention, one, or more, of the quantity of erase pulses, or maximum erase voltage, or other measure indicative of erase energy used to place the group of memory cells in an erased state can be determined. Thereafter, parameters, e.g., voltages, associated with a programming and/or programming verification process, can be appropriately set, or adjusted, at least partially based on this determined quantity indicative of erase energy used, e.g., programming voltage can be adjusted at lest partially based on the quantity of erase pulses used and/or the maximum erase voltage used. The operating parameters, e.g., voltage, associated with programming set, or adjusted, are used to program the group of memory cells.

Figure 4A:
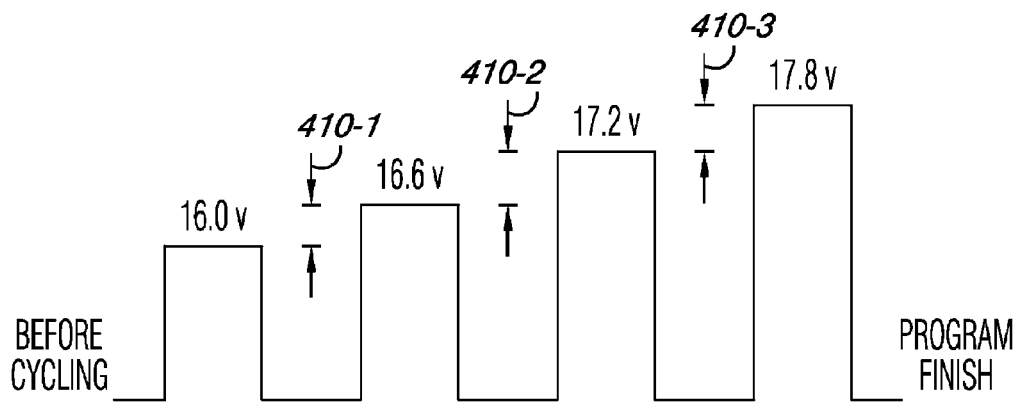
FIG. 4A illustrates a pulse technique for incrementally programming storage elements of a memory cell array before a number of cycles have occurred according to an embodiment of the present disclosure.

FIG. 4A illustrates a pulse technique for incrementally programming storage elements of a memory cell array before some number of program/erase cycles have occurred according to an embodiment of the present disclosure. The pulse technique shown in FIGS. 4A and 4B may be used with single level memory cell arrays (SLCs) and/or multiple level memory cell arrays (MLCs).

In the embodiment described by the illustration in FIG. 4A, a memory cell's programming process is shown including four voltage pulses, e.g., 16.0V, 16.6V, 17.2V, and 17.8V. However, embodiments of the present disclosure are neither limited to four pulses nor to a particular starting, ending, or step pulse voltage. For example, the number of pulses and/or the starting and ending pulse voltage before a number of cycles, e.g., before a number of program/erase cycles, can depend on various factors including the type of memory cell array.

As one of ordinary skill will appreciate, and as discussed further below, verify pulses can be utilized between the program pulses depicted in FIG. 4A. Verify pulses can, for example, be positioned between the 16.0V and 16.6V pulses, etc.

The number of verify pulses between program pulses can depend on the number of states represented by the memory cell. For example, a program voltage signal used to program a four state memory cell can have three verify pulses between the program pulses which increase incrementally. For example, a first verify pulse may be at 0.5V, a second verify pulse may be at 1.5V, and a third verify pulse may be at 3.0V.

FIG. 4A also depicts the voltage difference between pulses, i.e., an initial "step up" voltage before cycling, 410-1, 410-2, and 410-3 as being equal values of 0.6V. Embodiments of the present disclosure are not so limited, e.g., step up voltages 410-1, 410-2, and 410-3 can be different values from each other, and/or each individually greater than, or less than, the 0.6V shown in FIG. 4A.

Figure 4B:
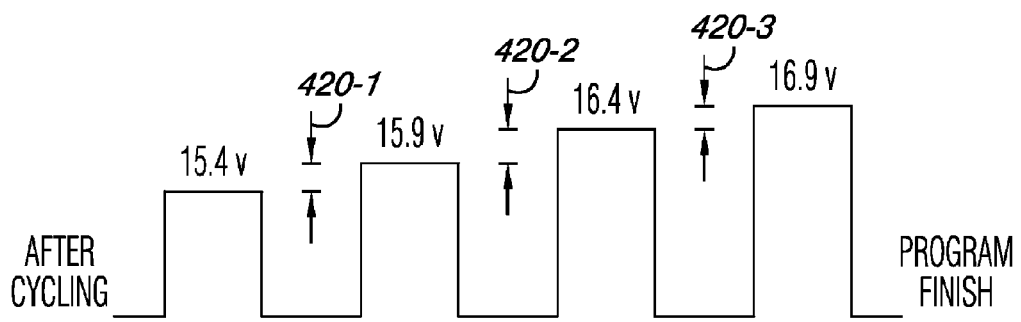
FIG. 4B illustrates a pulse technique for incrementally programming storage elements of a memory cell array after a number of cycles have occurred according to an embodiment of the present disclosure.

FIG. 4B illustrates a pulse technique using adjusted voltages for incrementally programming storage elements of a memory cell array after a number of cycles have occurred, according to an embodiment of the present disclosure. FIG. 4B includes four voltage pulses, e.g., 15.4V, 15.9V, 16.4V, and 16.9V. The reader will appreciate that the starting and step voltages have decreased from those shown in FIG. 4A, e.g., before an increase in hot count occurred. However, embodiments of the present disclosure are neither limited to four pulses nor to a particular starting, ending, or step pulse voltage. For example, the number of pulses and/or the starting and ending pulse voltage after a given hot count, e.g., a number of program/erase cycles, can depend on various factors including the type of memory cell array. As one of ordinary skill will appreciate, and as discussed further below, verify pulses can also be utilized between the program pulses depicted in FIG. 4B, e.g., between the 15.4V and 15.9V pulse, etc.

FIG. 4B also depicts the voltage difference between pulses, i.e., an after cycling "step up voltage," 420-1, 420-2, and 420-3 as being equal values of 0.5V. Embodiments of the present disclosure are not so limited, e.g., step up voltages 420-1, 420-2, and 420-3 can be different values from each other, and/or individually greater or less than 0.5V.

In one or more embodiments of the present disclosure, a programming parameter signal, e.g., programming voltage pulses, as shown in FIG. 4A can be applied to a row-select line in a memory block in order to program memory cells until a number of program/erase cycles have occurred, e.g., until 1,000, 10,000, 50,000, 100,000, etc. program/erase cycles have occurred. Thereafter, according to one or more embodiments, adjusted programming voltage pulses as shown in FIG. 4B can be applied to row-select lines in the memory block, for example, in order to program the memory cells. For example, the programming voltage signal of the embodiment represented in FIG. 4A can be applied before the quantity of processing cycles reaches a count of 10,000, and then the decreased programming voltage signals of FIG. 4B can be applied thereafter.

Embodiments of the present disclosure are not limited to the above example shown in FIGS. 4A and 4B. For instance, in one or more embodiments, an adjusted programming voltage signal, e.g., a signal in which the voltage pulses and/or step up voltages are decreased, may be applied after more or fewer program/erase cycles have occurred.

The operational characteristics illustrated by FIGS. 4A and 4B demonstrate a decrease in programming voltage pulses in the range of 0.6V to 0.9V between the before program/erase cycling and after program/erase cycling programming voltage signals. In one or more embodiments, the decrease can be the same voltage for two or more of the programming voltage pulses, e.g., a 0.6V decrease for all programming voltage pulses or e.g., 0.6V for a first pulse, 0.7V for a second pulse, and 0.8V for third and 0.9V for fourth pulses, etc.

In some embodiments, such as the embodiment illustrated in FIGS. 4A and 4B, the step up voltage can also be decreased after cycling, e.g., the step up voltage goes from 0.6V before cycling to 0.5V after cycling. However, in some embodiments, only the programming start voltage, e.g., Vpgm_start, or the step up voltage, e.g., Vstep, is decreased after program/erase cycling, keeping all other voltages associated with programming the same as was used for programming memory cells having a smaller hot count. For example, an initial programming voltage, e.g., Vpgm_start, may be decreased after a number of program/erase cycles, while the step up voltages remain unchanged. For instance, in some embodiments the step voltage before a number of program/erase cycles may remain at a value of 0.5V after a number of program/erase cycles, e.g., 1,000 cycles, have occurred.

Furthermore, it is possible to adjust the programming voltage signal more than one time throughout the useful life of a group of memory cells. That is, the programming voltage signal as illustrated in FIG. 4A, for example, can be applied to word lines in a memory block in order to program memory cells until the hot count reaches a particular quantity such as 1,000 counts. In such embodiments, a first set of adjusted programming voltages, e.g., the adjusted signals illustrated in FIG. 4B, can then be applied to program memory cells in a memory block until the hot count reaches another particular quantity such as 10,000 counts, for example. At such a point, a second set of adjusted programming voltage signals can be applied to program memory cells in the memory block.

As an example, the second adjusted signal associated with programming can, for example, contain incrementally increasing voltage pulses of 14.9V, 15.4V, 15.9V, and 16.4V, which have a lower starting voltage than the voltage pulses in the programming voltage signal depicted in FIG. 4B. Additionally, the step voltage could be changed as well, for example, to 0.4V rather than 0.5V. Such multiple adjustment embodiments can allow for smaller adjustments with respect to memory cell programming performance, and thus, more flexibility in adjusting different cells in a MLC array, e.g., having different wear rates, among other benefits.

Figure 5:
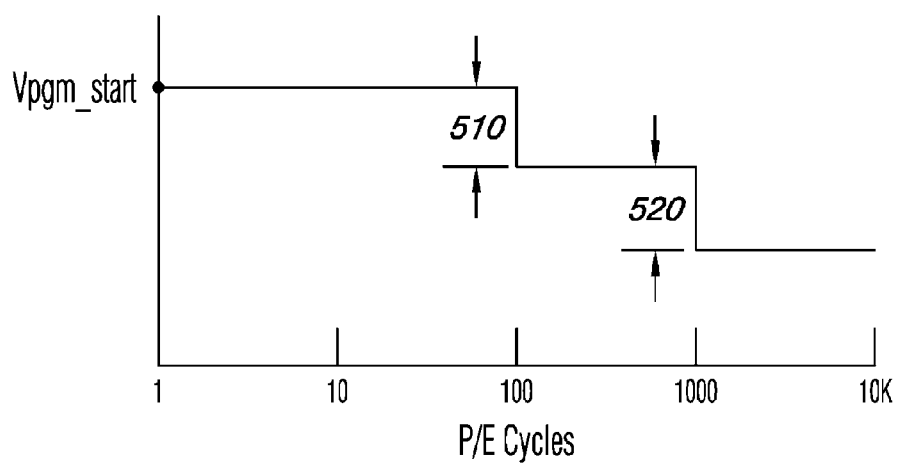
FIG. 5 illustrates a periodic decrease in the Vpgm voltage as the number of cycles increases for an embodiment of the present disclosure.

FIG. 5 illustrates a periodic decrease in the starting program voltage (Vprogram_start, or further abbreviated as Vpgm_start) as the number of processing cycles increases for an embodiment of the present disclosure. The performance characteristics shown in FIG. 5 illustrate the starting program voltage as a function of the number of processing cycles, e.g., program/erase cycles, i.e., hot count.

As used herein, Vpgm_start can refer to a single voltage used for programming, e.g., a series of one or more constant-magnitude voltage pulses, or to the voltage of an initial programming voltage pulse in a series of changing programming voltage pulses used to program memory cells in a memory block. For instance, Vpgm_start for the embodiment in FIG. 4A is 16.0V and for the embodiment in FIG. 4B is 15.4V.

The embodiment illustrated in FIG. 5 depicts Vpgm_start as being decreased multiple times, first by an amount 510 after a first number of cycles, e.g., 100 cycles, and second, being further decreased by an amount 520 after a second number of cycles, e.g., 1000 cycles. As stated herein, the decrease can be any suitable amount, for example, the amounts 510 and 520 are on the order of about 0.5V and, in one or more embodiments, may but need not be equal amounts throughout a programming pulse sequence. The value of amounts 510 and 520 may depend on the number of cycles that have occurred thus far, or occurred since the last pulse level adjustment. For instance, the decrease amount 520 may be greater or less than the decrease amount 510. Furthermore, additional decreases in Vpgm_start are contemplated by embodiments of the present invention, e.g., by some decrease amount at 10K cycles (not shown on FIG. 5).

As mentioned above, decreasing the programming starting voltage, and/or step up voltage, after a number of processing cycles, e.g., program/erase cycles, can stabilize programming performance with respect to the quantity of program/erase cycles to which the memory cell have been subjected by reducing the occurrence of over-programming which may be caused by electron trapping in the tunnel oxide layer of memory cells as described with respect to FIG. 3 above, for example. It should be pointed out that the quantity of programming pulses shown in FIGS. 4A and 4B remain constant, e.g., four, but embodiments of the present invention are not so limited. The quantity, duration, timing, or other aspects of the parameters, e.g., voltage signals, associated with programming may also be adjusted at least partially based on quantity of erase pulses and/or maximum erase voltage, used. However, it can be beneficial, and thus desirable, to maintain a uniform programming time duration independent of quantity of erase pulses used and/or maximum erase voltage used.

It should be noted that although the example embodiments illustrated in FIGS. 4A, 4B, and 5 depict programming voltage changes at threshold values of 100, 1,000, or 10,000 cycles, embodiments are not so limited. That is, embodiments of the present disclosure are not limited to adjusting a programming voltage after predetermined threshold hot count values, e.g., processing cycles, nor limited to the particular quantities of program/erase cycles shown in FIG. 5 at which programming voltage step changes are shown occurring in the illustrations, nor limited to only two (2) step changes. Furthermore, adjusting at least one operating voltage associated with programming is not limited to adjusting the programming start voltage and/or programming step voltage. Other voltages associated with programming may be adjusted based on hot count, in addition to, or in lieu of, programming start and step voltages, including but not limited to a pass-through voltage applied to a memory cell adjacent a memory cell being programmed, and/or a cell inhibit voltage, and/or a programming verification voltage, among others.

Figure 6:
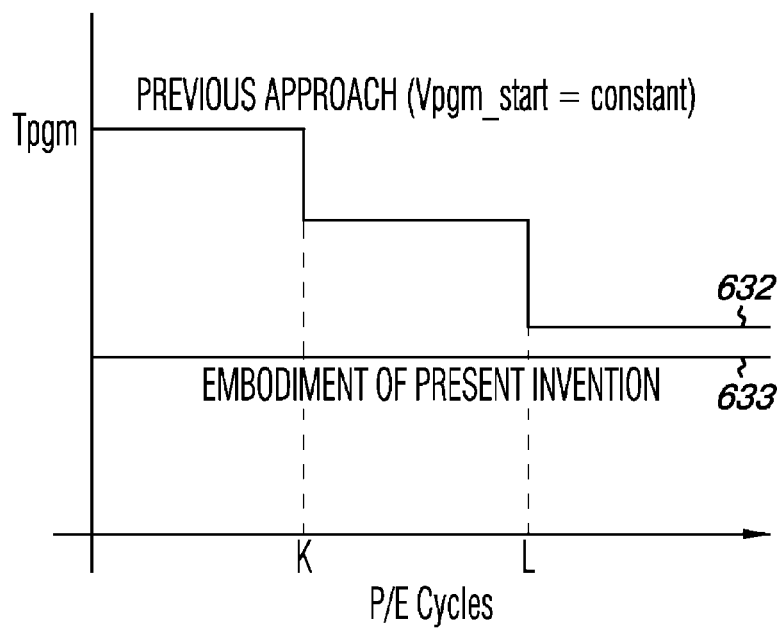
FIG. 6 illustrates memory cell programming time (Tpgm) as a function of the number of program/erase cycles.

FIG. 6 illustrates memory cell programming time (Tpgm) as a function of the number of program/erase cycles. A programming time characteristic associated with prior art memory cell operation 632, as well as a programming time characteristic 633 associated with one or more embodiments of the present invention are shown. The "previous approach" performance characteristic 632 illustrated in FIG. 6 assumes operating parameters, e.g., voltages, associated with programming remain unchanged as the quantity of program/erase cycles increases, and depicts programming time, e.g., Tpgm, periodically changing, e.g., decreasing. The programming time, e.g., Tpgm, characteristic of prior art memory cell performance 632 is shown decreasing multiple times, first by some amount after K program/erase cycles, e.g., 100 cycles, and second by another amount after L cycles, e.g., 1000 cycles. The indicators "K" and "L" are used to indicate that step changes in Tpgm occur at some number of program/erase cycles.

The programming time performance characteristic 633 illustrated in FIG. 6 corresponding to an embodiment of the present invention assumes operating parameters, e.g., voltages, associated with programming are adjusted based on the quantity of erase pulses used to place at least one memory cell into an erased state, depicts programming time, e.g. Tpgm, remaining constant. The reader will appreciate that faster programming, i.e., less time taken to programming, results in read threshold voltage distributions spreading out, i.e., being less compact, leading to overlapping profiles and indistinguishable logic states. According to embodiments of the present invention, by adjusting operating parameters, e.g., voltages, associated with programming, programming time, e.g., Tpgm 633, remains constant throughout program/erase cycling without causing over-programming, thereby retaining desirably compact read voltage profiles and well-defined threshold voltages. According to one or more embodiments of the present invention, programming time, e.g., Tpgm, is not sacrificed to ensure programming speed-up guard band. If programming parameters, e.g., voltages, are not adjusted as the quantity of erase pulses used increases (corresponding to increased program/erase cycling as is further explained later), and programming time, e.g., Tpgm, is also not adjusted to account for the un-adjusted programming voltages, then memory cells can become over-programmed and exhibit undesirable performance characteristics as previously described.

Figure 7:
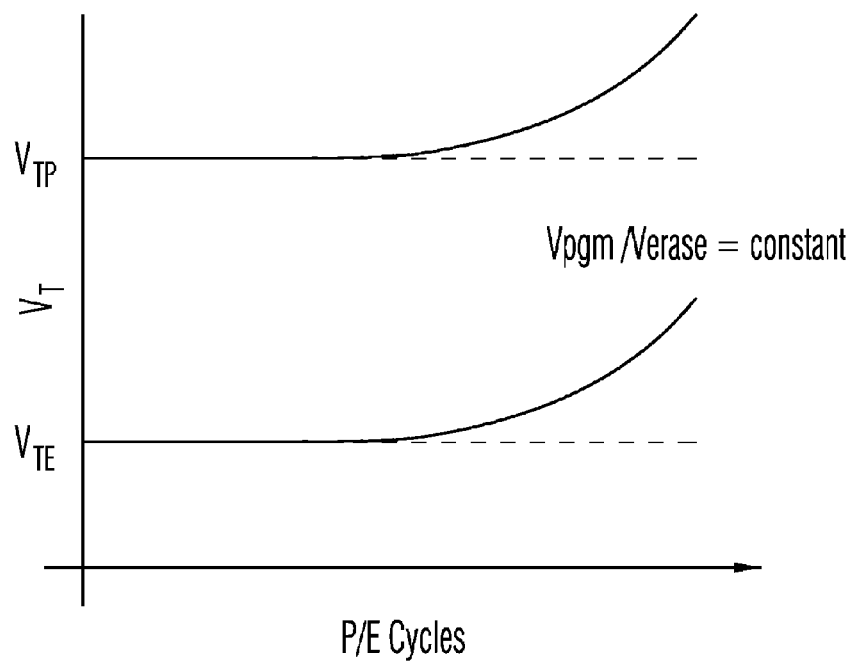
FIG. 7 illustrates threshold voltage increases as the number of program/erase cycles increases for an embodiment of the present disclosure.

FIG. 7 illustrates how threshold voltages ($V_T$) increases as the number of program/erase cycles increases for an embodiment of the present disclosure. One having ordinary skill in the art will appreciate that as hot count increases, memory cell programming performance speeds-up and erase performance slows down, as program/erase cycling increases for reasons previously illustrated with respect to electron charge migration. The threshold voltages for both erase ($V_{TE}$) and program ($V_{TP}$) increase as the hot count increases for memory cells. These changes are related in cause, and therefore $V_{TE}$ and $V_{TP}$ tend to increase approximately proportionate to one another such that the ratio between the two threshold voltages remains constant, as is illustrated in FIG. 7.

Figure 8A:
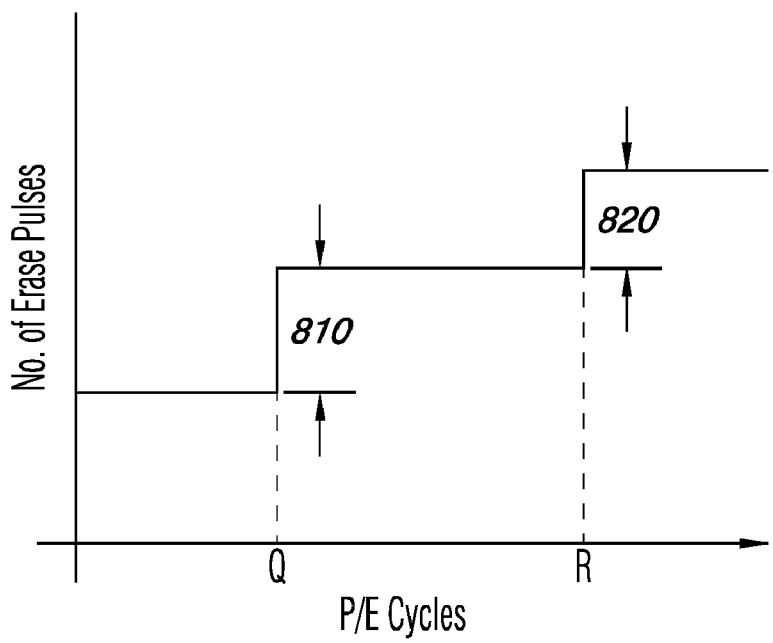
FIG. 8A illustrates a distribution of the number of erase pulses as the number of program/erase cycles increases for an embodiment of the present disclosure.

FIG. 8A illustrates a periodic increase in the number of erase pulses used to accomplish a satisfactory erase operation, i.e., place a memory cell in an erase state, as a function of the number of processing cycles, e.g., program/erase cycles. As one having ordinary skill in the art will appreciate, a memory cell can be placed in an erased state by applying a number of erase pulses to a substrate body over which the memory cell is formed, and includes applying the number of erase pulses until a threshold voltage, e.g., $V_T$, of the memory cell reaches a threshold level. The number of erase pulses used to place one or more memory cells in an erased state can be determined by counting, tracking, incrementing, or other means well known by those having ordinary skill in the art.

In general, the quantity of erase pulses used to erase a group of memory cells increase as program/erase cycles increase. Erase performance is shown in FIG. 8A as periodically requiring some additional quantity of erase pulses to accomplish memory cell erasure as the quantity of program/erase cycles increases, first by a first amount of erase pulses 810 after Q program/erase cycles, e.g., 100 cycles, and second by a second amount of erase pulses 820 after R cycles, e.g., 1000 cycles. The indicators "Q" and "R" are used to indicate that step changes in the quantity of erase pulses used to place at least one memory cell in an erased state occur at some number of program/erase cycles. Since memory cells are typically programmed and/or erased in a group, e.g., a block or blocks, this periodic increase in the number of erase pulses used to place the memory cells in an erased state is associated with the particular group, e.g., block or blocks, of memory cells.

The number of erase pulses used to place a memory cell in an erased state may be characterized by a range, rather than by a single integer quantities. For instance, a range of 1 to 5 erase pulses may be need to accomplish erasure for the first Q program/erase cycles, e.g., 100 cycles. Thereafter, a range of 5 to 10 erase pulses may be used to accomplish erasure until the quantity of program/erase cycles reaches R cycles, e.g., 1000 cycles. Above Q program/erase cycles, 10 to 15 erase pulses may be used to accomplish erasure, until the quantity of program/erase cycles reaches another threshold, e.g., 10,000 cycles, (not shown in FIG. 8). Additional cycling thresholds may be established using, for example, smaller ranges of erase pulses, e.g., 2 to 3 pulses rather than 5-10.

The first 810 and second 820 amounts by which the quantity of erase pulses must increase to achieve acceptable erasure may, or may not, be equal amounts. The second amount 820 may be more, or less, or the same, amount as the first amount 810. The quantities Q and R need not be evenly spaced, and there may be additional thresholds of quantity of program erase cycles by which the number of erase pulses need to accomplish erase operations increases. The particular value of the first 810 and second 820 amounts of erase pulses used may depend on the number of cycles that have occurred thus far, or since the last step change in number of erase pulses required. The number of program/erase cycles, e.g., Q and R, may, but need not, correspond to the quantity of program/erase cycles shown in other figures of this disclosure at which step changes in characteristic performance occurs. The periodic increase illustrated in FIG. 8A assumes the characteristics of an erase sequence remain unchanged except for the quantity of erase pulses used. The magnitude of change in the quantity of erase pulses required may be more, or less, if erase sequence characteristics change (except by quantity of erase pulses used) with respect to program/erase cycling. It is noted that although the description accompanying the example embodiments illustrated in FIG. 8A include step changes in erase performance at certain threshold values of Q and R cycles, e.g., 100 and 1,000 cycles respectively, embodiments are not so limited. That is, embodiments of the present disclosure are not limited to finite step changes after predetermined threshold hot count values, e.g., processing cycles.

Having a reasonably well-defined relationship between the hot count of at least one memory cell, and the quantity of erase pulses need to erase the at least one memory cell, permits hot count to be estimated from the quantity of erase pulses used to place a memory cell in an erased state. Alternatively, operational adjustments can be known without determining hot count at all since such adjustments to operating parameters can be made based on the quantity of erase pulses used (as being indicative of program/erase cycling degradation). According to some embodiments of the present invention, a range of hot count can be estimated for a particular unit of memory cell(s) by determining a quantity of erase pulses used to place the memory cell(s) of the array in an erased state. It follows, that operating parameters, e.g., voltages, associated with programming the memory cell(s) can then be adjusted based on the determined quantity of erase pulses, due to the proportionality with hot count. Since the quantity of erase pulses used to erase a respective unit of memory cell(s) is easily determined at each erase cycle using control circuitry, there is no need to store the accumulated hot count for each unit of memory cells, thereby saving both circuit complexity and real estate, i.e., footprint.

As discussed in conjunction with FIG. 1, conventionally, the number of program/erase cycles performed on a memory block is stored as a data entry within the memory array, e.g., memory array 100. This requires continuous tracking of the quantity of program/erase cycles to which a particular unit of memory cells have been subjected to thus far. Monitoring this quantity requires associated control circuitry and processing. Storing the program/erase cycle quantity occupies memory within the particular arrangement of memory cells which otherwise might be used for other purposes, i.e., decreasing net memory cell capacity.

A memory cell erase sequence is well understood by those having ordinary skill in the art, involving application of erase voltages, followed by a confirmation process, e.g., erase verify, to check that erasure has indeed occurred. Erase pulses continue to be applied to the memory cells until erasure occurs according to predefine criteria. Tracking the count of erase pulses used can be done during each erase operation, or may only be done periodically. According to some embodiments of the present invention, it is not be necessary to track the count of erase pulses during every erase process in order to provide sufficient information by which to periodically adjust operating parameters, e.g., voltages, associated with subsequent programming. Thus, according to one or more embodiments of the present invention, the quantity of program/erase cycles to which a particular unit of memory cells have been subjected to thus far need not be continuously stored in memory. Memory space can be freed-up by not storing such information for each respective unit of memory cells. When the relationship between programming/erase cycling and number of erase pulses used to accomplish erasure of the memory cells is known for a particular construction, arrangement, or configuration of memory cells, the quantity of programming/erase cycles can be dynamically determined from the quantity of erase pulses used to accomplish erasure during the last (or a recently previous) erase sequence.

As one having ordinary skill in the art will appreciate, it is not necessary to determine a precise quantity of program/erase cycles in implementing the embodiments of the present disclosure, rather it can be sufficient to merely understand the range of program/erase cycles to which a range of erase pulse quantity corresponds, and within which a particular programming characteristic or operating voltage associated with programming is established, i.e., between quantities of program/erase cycles at which a step change occurs. In fact once the relationship between quantity of erase pulses used and hot count is known, the hot count need not be retained as a basis for adjusting programming parameters, since adjustments to operating parameters, e.g., voltages, associated with programming can be corresponded directly with quantity of erase pulses. For instance, FIG. 5 could be re-drawn to plot programming start voltage with respect to quantity of erase pulses. According to one embodiment of the present invention, the quantity of erase pulses are expressed as ranges, e.g., if recent quantity of erase pulses used to achieve erasure falls within a certain first range, use a first set of operating parameters associated with programming, and if quantity of erase pulses used to achieve erasure falls within a certain second range, use a second set of operating parameters associated with programming, etc.

Figure 8B:
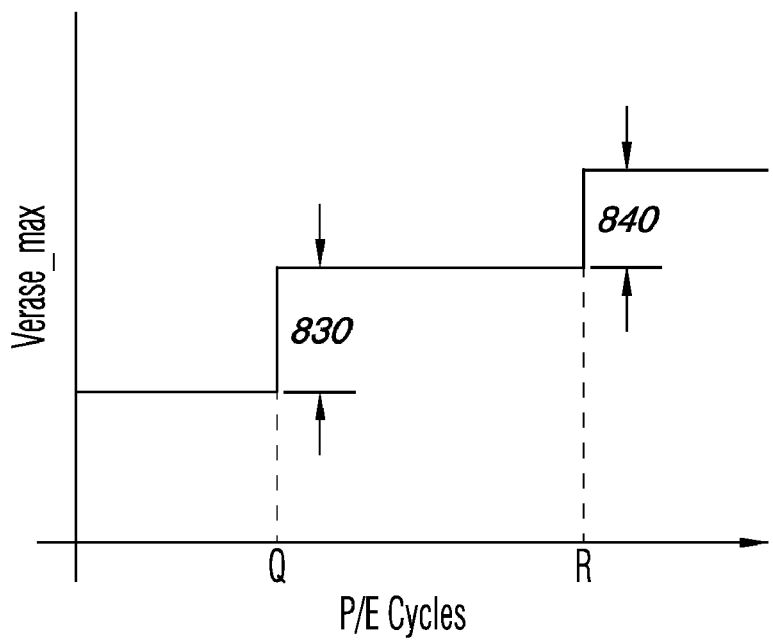
FIG. 8B illustrates a distribution of the maximum erase voltage as the number of program/erase cycles increases for an embodiment of the present disclosure.

FIG. 8B illustrates a periodic increase in the magnitude of maximum erase voltage, e.g., Verase_max, used to accomplish a satisfactory erase operation, i.e., place a memory cell in an erase state, as a function of the number of processing cycles, e.g., program/erase cycles. As an alternative to, or in addition to, applying an increasing number of erase pulses to erase a group of memory cells as the quantity of program/erase cycles increase, the voltage applied during erasure may also be increased. Therefore, the maximum erase voltage used can also be associated with a quantity of program/erase cycles to which a particular group of memory cells has thus far been subjected.

In general, the magnitude of the maximum erase voltage used to erase a group of memory cells increase as program/erase cycles increase. Erase performance is shown in FIG. 8B as periodically requiring some additional increase in the magnitude of the maximum voltage used to erase a group of memory cells as the quantity of program/erase cycles increases. The maximum erase voltage may be increased first by a first incremental voltage 830 after Q program/erase cycles, e.g., 100 cycles, and increased second by a second incremental voltage amount 840 after R cycles, e.g., 1000 cycles. The indicators "Q" and "R" are used to indicate that step changes in the maximum erase voltage used to place a group of memory cells in an erased state occur at some number of program/erase cycles. Since memory cells are typically programmed and/or erased in blocks, this periodic increase in maximum erase voltage used to place the memory cells in an erased state is associated often with a particular block of memory cells, or other functional group.

FIG. 9A illustrates a table of operating parameters, e.g., operating voltages, associated with programming that can be used in accordance with embodiments of the present disclosure. Several operating parameters, e.g., voltages, associated with programming, including programming start voltage (Vpgms), programming pulse step voltage (Vstep), program verify voltage (PV), and pass-through voltage (Vpass), may be adjusted based on the number of erase pulses used to place a memory cell of interest into an erased state. As previously described, the quantity of erase pulses (or maximum erase voltage magnitude) used corresponds the number (or at least a range of) program/erase (P/E) cycles to which the memory cells about to be programmed have been previously subjected.

When the number of erase pulses recently used is below a first quantity, e.g., X, at least one of the operating parameters, e.g., voltages, associated with programming is set at their respective initial levels, e.g., Vpgms, Vstep, PV and Vpass. When the number of erase pulses used to accomplish erasure, increases to a range between the first quantity and a second quantity, e.g., between X and Y, then at least one of the operating parameters, e.g., voltages, associated with programming are adjusted. According to one specific example embodiment illustrated in FIG. 9A, as the quantity of erase pulses used to achieve erasure increases to the range between X and Y, Vpgms is decreased by 200 mV, Vstep is decreased by 100 mV, Vpass is decreased by 300 mV, and PV is increased by 50 mV. However, embodiments of the present invention are not so limited. According to other embodiments, program start voltage is decreased in increments of about 200 mV, Vstep is decreased in increments of about 100 mV, Vpass is decreased in increments of about 300 mV, and PV is increased by increments of about 50 mV. The adjustment made to a particular memory cell operating parameter associated with programming is based on specific operating characteristics of the memory cells being programmed/erased, which may require more, or less, change to maintain predictable memory cell write/read performance than the values provided in FIG. 9A.

When the quantity of erase pulses used to place memory cell(s) in an erased state, increases beyond the second quantity, Y, one or more operating parameters associated with programming are adjusted again, e.g., at least one of Vpgms, Vstep, Vpass, and PV. FIG. 9A shows the second adjustment amounts for each respective operating voltage associated with programming being incrementally the same as the first amount by which each respective operating voltage was adjusted. However, embodiments of the present invention are not so limited. As previously discussed with respect to FIGS. 4A and 4B for programming start and step voltages, the amounts by which any of the operating voltage levels are adjusted may be the same as the first respective adjustment amount, but need not be. In addition, the amount by which any particular operating voltage associated with programming is adjusted may be the same, or different, from one or more of the other operating voltage adjustments.

Furthermore, the table of FIG. 9A is illustrative of changing operating voltage magnitudes based on quantity of erase pulses used recently to accomplish erasing the memory cell(s) prior to programming. As one having ordinary skill in the art will appreciate, from measuring the quantity of erase pulses recently used to erase a group, e.g., block, of memory cells, e.g., by counting, the number of program/erase cycles becomes an unnecessary intermediate reference point which no longer has to be precisely known, and adjustment of operating voltage(s) associated with programming may be made directly based on a corresponding quantity of erase pulses used. For convenience, the incremental changes made to each of the respective voltages associated with programming shown in FIG. 9A all occur at the same threshold quantity of erase pulses used. However, embodiments of the present invention are not so limited. The ranges of erase pulses used for adjusting a particular operating voltage level may be the same as one or more other operating voltage(s), but need not be. For example, the range of erase pulses used and associated with a particular operating voltage adjustment may be independent and different than the range of erase pulses used and associated with any other operating voltage associated with programming. Alternatively, a range of erase pulses used, during which a particular operating voltage(s) is constant, may be the same range of erase pulses used at which one or more other operating parameters, e.g., voltages, associated with programming are constant (as is shown in FIG. 9A).

The particular location of range boundaries, e.g., defining ranges of erase pulses used, at which an operating parameter, e.g., voltage, associated with programming is adjusted, may be at different levels than are described herein, and may include more or fewer ranges, depending on operating considerations associated with the memory cell arrangement being implemented. One having ordinary skill in the art can determine each appropriate boundary condition, as well as the magnitude of different ranges of the quantity of erase pulses used, based on the particular characteristics of the memory cells and/or the location of the boundary, etc.

FIG. 9B illustrates another table of operating voltages associated with programming that can be used in accordance with another embodiment of the present disclosure. The table shown in FIG. 9B resembles the table shown in FIG. 9A with the exception that Vstep and PV remain unchanged throughout the range of the quantity of erase pulses used to erase the memory cells about to be programmed. One or more of the operating voltages associated with programming need not change based on quantity of erase pulses used, and any particular operating voltage associated with programming may be held constant as appropriate for all quantities of erase pulses used to accomplish erasure for a particular group of one or more memory cells.

Furthermore, an individual operating parameter, e.g., voltage, associated with programming may be adjusted at one particular quantity of erase pulses need to erase a particular set of memory cells, and not be adjusted at another subsequent threshold quantity of erase pulses, even if one or more other operating voltage adjustments are made at the subsequent threshold. For example, Vstep may change at a quantity of X erase pulses, but not at a quantity of Y erase pulses; or Vstep may not change at a quantity of X erase pulses, and change at a quantity of Y erase pulses, etc. One operating voltage associated with programming may change only at a first threshold quantity of erase pulses used, and not at a second threshold; and another operating voltage may change only at the second threshold quantity of erase pulses used, and not at the first threshold.

Additional operating steps and parameters, e.g., voltages, associated with programming, or associated with erasure, or involving other parameters, or aspects of the operating parameters, e.g., voltages, other than magnitude, or operating voltages other than those illustrated in FIGS. 9A and 9B, may be adjusted, e.g., modified or otherwise changed, based on quantity of erase pulses or maximum erase voltage used to place the affected memory cell(s) in an erased state prior to the programming. For example, operating voltages such as Vinhibit and/or Vsoft_program, may be adjusted based on a quantity of determined erase pulses used to place at least one memory cell of an array in an erased state.

According to one example method for programming an arrangement of non-volatile memory cells, previously-programmed memory cells are erased, and the quantity of erase pulses (similar to the programming pulses illustrated in FIGS. 4A and 4B) but of unique magnitude and duration) used to place the arrangement of memory cells in an erased state is determined. At least one operating voltage associated with programming, e.g., Vpgms, Vstep, Vpass, PV, Vinhibit, and/or Vsoft_program, is adjusted, e.g., trimmed or set, based on the quantity of erase pulses determined. The at least one memory cell is programmed using the at least one adjusted operating voltage. The quantity of erase pulses determined is representative, e.g., corresponds to a quantity, or an estimated range, of program/erase cycles since erasure requires more energy as charge migrates to, and becomes trapped in, boundary dielectric regions through repeated application of programming and erase potentials to the memory cells. Adjusting the least one operating voltage associated with programming can entail an increase, or decrease, in magnitude; however, embodiments of the present invention are not so limited. Respective voltage signals may be modified in other respects to maintain desirable, or predictable, memory cell performance.

Typically, Vpgm, Vstep, and Vpass are set at smaller levels as the quantity of erase pulses used to place the affected memory cells in an erased state increases. All other parameters being held constant, maintaining a constant programming voltage magnitude, e.g., Vpgm, will tend to decrease programming time and lead to over-programming as the quantity of program/erase cycles increases. All other parameters being held constant, maintaining a constant programming step voltage increment magnitude, e.g., Vstep, will also tend to decrease programming time, and lead to tightening of the threshold voltage (Vt) distribution and over-programming, as the quantity of program/erase cycles increases. All other parameters being held constant, maintaining a constant program verify voltage magnitude, e.g., PV, will tend to decrease programming time and increase threshold voltage (Vt) margin for data retention as the quantity of program/erase cycles increases. All other parameters being held constant, maintaining a constant pass voltage magnitude, e.g., Vpass, will tend to adversely impact program disturbance failure rates as the quantity of program/erase cycles increases. All other parameters being held constant, maintaining a constant soft programming voltage magnitude, e.g., Vsoft_pgm, will tend to decrease soft programming time and lead to over-soft programming as the quantity of program/erase cycles increases. Soft programming may, or may not, occur to complete the erasure of the particular memory cell(s), with or without adjustment to Vsoft_program. Thereafter, the arrangement of memory cells is programmed using the at least one adjusted operating voltage associated with the programming process.

FIG. 10 illustrates a table 1010 of operating voltages that can be used in accordance with embodiments of the present disclosure. The table 1010 illustrates voltages applied to a bit line (BL), a drain select line (SGD), a number of row-select lines, e.g., word lines, (WL-0 through WL-31), a source select line (SGS), a common source line (SOURCE), and a substrate body (P-well) associated with a string 1009 of non-volatile memory cells coupled in series between a select gate source transistor and a select gate drain transistor. The table 1010 illustrates examples of voltages applied to the string 1009 during an erase operation (ERASE), erase verify operation (ERASE VERIFY), a program operation (PROGRAM WL-0), and a read operation (READ WL-0READ) 1039.

In various erase verify operation embodiments, as shown in table 1010, a bit line (BL) is biased at 0V, a common source line (SOURCE) is biased at 1.5V. One of ordinary skill in the art will appreciate that the sense line and source could be oppositely biased, or have different voltages applied. In some embodiments, a first select gate transistor, e.g., a select gate source transistor, coupled to a string of memory cells is biased at a first voltage while a second select gate transistor, e.g., a select gate drain transistor, coupled to the string is biased at a second voltage. In some embodiments, and as shown in FIG. 10, the first and the second voltages applied to the first and second select gate transistors can be the same voltage, e.g., 3.5V in this example. In some embodiments, the select gate transistors are biased at a voltage of between 0V and 5V. In some embodiments, non-edge row-select lines are biased at the same voltage, e.g. 0V in this example. In one or more embodiments, edge row-select lines are biased at a higher voltage than the non-edge row-select lines during an erase verify operation. Embodiments are not so limited.

An erase verify failure can result if any of the cells in the string is determined to be in a state other than the erased state, e.g., if any of the cells is determined to have a threshold voltage level greater than 0V in this example. An erase operation performed on the string 1009 can have different effects on edge cells 1011-1 and 1011-N than non-edge ells 1011-2, . . . , 1011-(N-1). More residual charge may remain on an edge cell than a non-edge cell, leading to erase verify failures. The erase verify operation described above helps compensate for slow erase effects on edge cells 1011-1 and 1011-N by reducing the incidence of erase verify failures for edge cells 1011-1 and 1011-N.

As one of ordinary skill in the art will appreciate, in a read operation performed on a selected memory cell in a NAND string, the unselected memory cells of the string are biased so as to be in a conducting state. Such unselected memory cells are said to have a pass-read voltage applied to them. An example of operating voltages associated with a read operation is shown in FIG. 10. In such a read operation, the data stored in the selected cell can be based on the current and/or voltage sensed on the sense line corresponding to the string. For instance, data stored in the selected cell can be based on whether the sense line voltage changes by a particular amount or reaches a particular level in a given time period.

When the selected cell is in a conductive state, current flows between the source line contact at one end of the string and a sense line contact at the other end of the string. As such, the current associated with reading the selected cell is carried through each of the other cells in the string, the diffused regions between cell stacks, and the select transistors.

In one operational reading embodiment, a first select gate transistor, e.g., a select gate source transistor, coupled to a string of memory cells is biased at a first voltage while a second select gate transistor, e.g., a select gate drain transistor, coupled to the string is biased at a second voltage. As shown in FIG. 10, the first and the second voltages applied to the first and second select gate transistors can be the same voltage, e.g., 3.5V. The select gate transistors are biased at a voltage of between 0V and 5V.

Non-edge row-select lines that are not selected for reading are biased with a pass-read voltage, e.g., Vpass-read, in column 1039. Edge row-select lines that are not selected for reading may be biased with the same or higher pass-read voltage to compensate for slow erase effects on edge row-select lines; however, embodiments are not so limited. In this operational embodiment example, edge row-select lines selected for reading are not biased at a higher voltage than non-edge row-select lines selected for reading. Edge-row and non-edge row-select lines are biased at, for example, 0V for reading.

As shown in the example embodiment of FIG. 10, table 1010, a reading operation, e.g., READ (WL-0READ) 1039, can include biasing the bit line (BL) at a voltage of, for example, 1.0V, and the source line (SOURCE), and the substrate body (P-well) associated with the string of cells, e.g., string 1009, at a ground voltage, e.g., 0V. Again, embodiments are not limited to the example voltages illustrated in table 1010. For instance, in one or more embodiments, the sense line, source line, and substrate body associated with a string, e.g., 1009, can each be biased at different voltages. Biasing at least the substrate body, the select gate source line (SGS), and the select gate drain line (SGD) at a low voltage with respect to the pass-read voltage (Vpass-read) can facilitate reading the selected cell, which is biased with a voltage lower than the pass-read voltage. In table 1010, column 1039, for example, the pass-read voltage for edge cells and non-edge cells is 3.5V.

In one or more embodiments of the present disclosure, an adjustment to the voltages applied during a programming operation can be performed with respect to a string or block of memory cells at least partially based on the maximum erase voltage recently used, or the quantity of erase pulses recently used, to place the particular group, e.g., block, of memory cell(s) in an erased state. The programming operational parameter, e.g., voltages, etc., adjustments can be performed at particular quantities of erase cycles used or maximum erase voltage levels, e.g., at the quantities of erase cycles used or magnitude of maximum erase voltage used that corresponds to a range of 1,000 program/erase cycles. In some embodiments, adjustments are made to the voltages applied during a programming operation for only a subset group of cells, e.g., a string, block, or other portion of memory cells, in response to a particular number of erase pulses used, or maximum erase voltage used, corresponding to a certain range of program/erase operation cycles, e.g., 500 or 5,000, having been performed on the subset. However, embodiments are not limited to these examples, and embodiments are not limited to the example parameters, e.g., voltages, illustrated throughout this disclosure.

Figure 11:
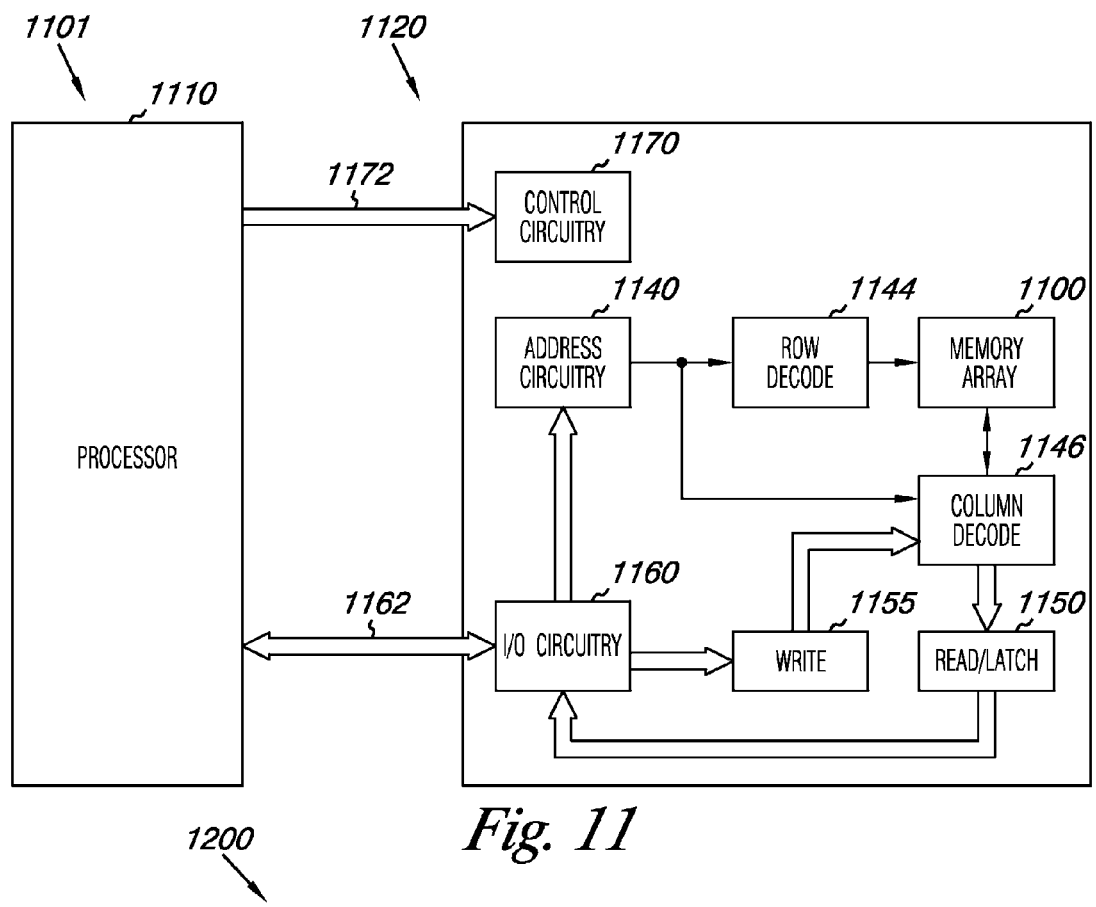
FIG. 11 is a functional block diagram of an electronic memory system having at least one memory device in accordance with an embodiment of the present disclosure.

FIG. 11 illustrates a memory system 1101, which includes a processor 1110 and is coupled to a non-volatile memory device 1120 that includes a memory array 1100 of non-volatile cells, e.g., a memory array such as array 100 shown in FIG. 1 or array 200 shown in FIG. 2. The memory system 1101 can include separate integrated circuits or both the processor 1110 and the memory device 1120 can be on the same integrated circuit. The processor 1110 can be a microprocessor or some other type of controlling circuitry such as an application-specific integrated circuit (ASIC).

The memory device 1120 includes an array of non-volatile memory cells 1100, which can be floating gate flash memory cells with a NAND architecture. The control gates of each row of memory cells are coupled with a row-select line, while the drain regions of the memory cells are coupled to sense lines. The source regions of the memory cells are coupled to source lines, as the same has been illustrated in FIG. 1. As will be appreciated by those of ordinary skill in the art, the manner of connection of the memory cells to the sense lines and source lines depends on whether the array is a NAND architecture, a NOR architecture, and AND architecture, or some other memory array architecture.

The embodiment of FIG. 11 includes address circuitry 1140 to latch address signals provided over I/O connections 1162 through I/O circuitry 1160. Address signals are received and decoded by a row decoder 1144 and a column decoder 1146 to access the memory array 1100. In light of the present disclosure, it will be appreciated by those skilled in the art that the number of address input connections depends on the density and architecture of the memory array 1100 and that the number of addresses increases with both increased numbers of memory cells and increased numbers of memory blocks and arrays.

The memory array 1100 includes non-volatile memory cells that can utilize adjusted operating parameters, e.g., voltages, associated with programming, the adjustments being based on a quantity of erase pulses, or maximum erase voltage, used to place memory cell(s) in an erased state, according to embodiments described herein. The memory device 1120 reads data in the memory array 1100 by sensing voltage and/or current changes in the memory array columns using sense/buffer circuitry that in this embodiment can be read/latch circuitry 1150. The read/latch circuitry 1150 can be coupled to read and latch a row of data from the memory array 1100. I/O circuitry 1160 is included for bi-directional data communication over the I/O connections 1162 with the processor 1110. Write circuitry 1155 is included to write data to the memory array 1100.

Control circuitry 1170 decodes signals provided by control connections 1172 from the processor 1110. These signals can include chip signals, write enable signals, and address latch signals that are used to control the operations on the memory array 1100, including read, write, heal, and erase operations. In one or more embodiments, the control circuitry 1170 is responsible for executing instructions from the processor 1110 to perform the operating and programming embodiments of the present disclosure. The control circuitry 1170 can be a state machine, a sequencer, or some other type of controller. It will be appreciated by those skilled in the art that additional circuitry and control signals can be provided, and that the memory device detail of FIG. 11 has been reduced to facilitate ease of illustration.

Figure 12:
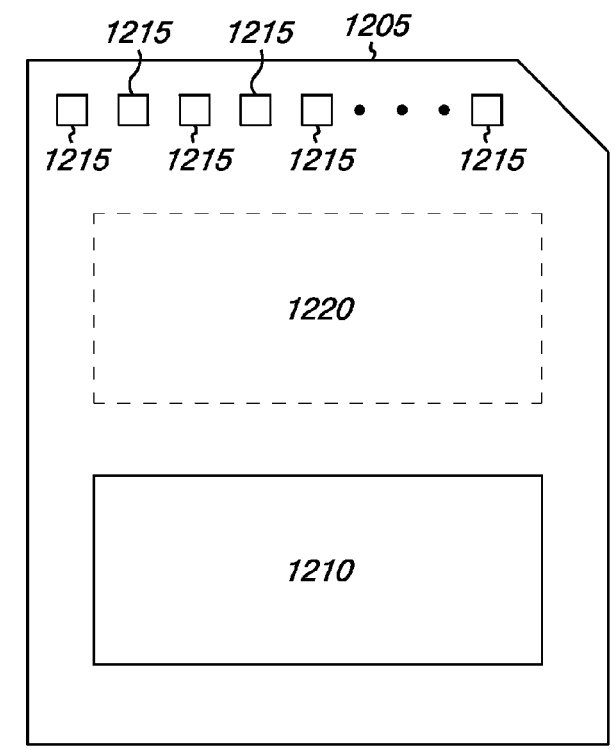
FIG. 12 is a functional block diagram of a memory module having at least one memory device in accordance with an embodiment of the present disclosure.

FIG. 12 is a functional block diagram of a memory module having at least one memory device in accordance with an embodiment of the present disclosure. Memory module 1200 is illustrated as a memory card, although the concepts discussed with reference to memory module 1200 are applicable to other types of removable or portable memory, e.g., USB flash drives, and are intended to be within the scope of "memory module" as used herein. In addition, although one example form factor is depicted in FIG. 12, these concepts are applicable to other form factors as well.

In some embodiments, memory module 1200 will include a housing 1205 (as depicted) to enclose one or more memory devices 1210, though such a housing is not essential to all devices or device applications. At least one memory device 1210 includes an array of non-volatile memory cells programmed using operating parameters, e.g., voltages, associated with programming which are adjusted based a quantity of erase pulses, or maximum erase voltage, recently used to place the memory cells in an erased state, according to embodiments described herein. Where present, the housing 1205 includes one or more contacts 1215 for communication with a host device. Examples of host devices include digital cameras, digital recording and playback devices, PDAs, personal computers, memory card readers, interface hubs and the like. For some embodiments, the contacts 1215 are in the form of a standardized interface. For example, with a USB flash drive, the contacts 1215 might be in the form of a USB Type-A male connector. For some embodiments, the contacts 1215 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 1215 provide an interface for passing control, address and/or data signals between the memory module 1200 and a host having compatible receptors for the contacts 1215.

The memory module 1200 may optionally include additional circuitry 1220, which may be one or more integrated circuits and/or discrete components. For some embodiments, the additional circuitry 1220 may include a memory controller for controlling access across multiple memory devices 1210 and/or for providing a translation layer between an external host and a memory device 1210. For example, there may not be a one-to-one correspondence between the number of contacts 1215 and a number of 1210 connections to the one or more memory devices 1210. Thus, a memory controller could selectively couple an I/O connection (not shown in FIG. 12) of a memory device 1210 to receive the appropriate signal at the appropriate I/O connection at the appropriate time or to provide the appropriate signal at the appropriate contact 1215 at the appropriate time. Similarly, the communication protocol between a host and the memory module 1200 may be different than what is required for access of a memory device 1210. A memory controller could then translate the command sequences received from a host into the appropriate command sequences to achieve the desired access to the memory device 1210. Such translation may further include changes in signal voltage levels in addition to command sequences.

The additional circuitry 1220 may further include functionality unrelated to control of a memory device 1210 such as logic functions as might be performed by an ASIC. Also, the additional circuitry 1220 may include circuitry to restrict read or write access to the memory module 1200, such as password protection, biometrics or the like. The additional circuitry 1220 may include circuitry to indicate a status of the memory module 1200. For example, the additional circuitry 1220 may include functionality to determine whether power is being supplied to the memory module 1200 and whether the memory module 1200 is currently being accessed, and to display an indication of its status, such as a solid light while powered and a flashing light while being accessed. The additional circuitry 1220 may further include passive devices, such as decoupling capacitors to help regulate power requirements within the memory module 1200.

CONCLUSION

Methods, devices, modules, and systems for programming non-volatile memory cells have been shown. One method includes determining a quantity of erase pulses used to place a group of memory cells of the array in an erased state, and adjusting at least one operating parameter associated with programming the group of memory cells at least partially based on the determined quantity of erase pulses.

Although specific embodiments have been illustrated and described herein, those ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating an array of memory cells, the method comprising:
   determining a quantity of erase pulses used to place a group of memory cells of the array in an erased state; and
   adjusting at least one operating parameter associated with programming the group of memory cells at least partially based on the quantity of erase pulses;
   wherein adjusting includes:
      maintaining the at least one operating parameter at an initial level when the quantity of erase pulses is below a first quantity;
      adjusting one or more of the at least one operating parameter to an adjusted level when the quantity of erase pulses is between the first quantity and a second quantity; and
      adjusting one or more of the at least one operating parameter to a different adjusted level when the quantity of erase pulses is greater than the second quantity.

2. The method of claim 1, wherein the method includes programming the group of memory cells using the at least one adjusted operating parameter.

3. The method of claim 2, wherein adjusting includes decreasing a magnitude of at least one operating voltage.

4. The method of claim 3, wherein adjusting includes decreasing the magnitude for at least one of
   a program start voltage applied to the at least one memory cell,
   a program step voltage applied to the at least one memory cell, and
   a pass-through voltage applied to a memory cell adjacent to the at least one memory cell.

5. The method of claim 2, wherein the method includes increasing at least one operating voltage associated with programming the group of memory cells based on the quantity of erase pulses.

6. A memory device comprising:
   an array of memory cells; and
   a controller coupled to the array of memory cells and configured to:
      determine a quantity of erase pulses used to place a group of memory cells of the array in an erased state; and
      adjust at least one operating parameter associated with programming the group of memory cells at least partially based on the quantity of erase pulses;
      wherein the controller is configured to:
         maintain the at least one operating parameter at an initial level when the quantity of erase pulses is below a first quantity;
         adjust one or more of the at least one operating parameter to an adjusted level when the quantity of erase pulses is between the first quantity and a second quantity; and
         adjust one or more of the at least one operating parameter to a different adjusted level when the quantity of erase pulses is greater than the second quantity.

7. The memory device of claim 6, wherein the controller is further configured to program the group of memory cells using the at least one adjusted operating parameter.

8. The memory device of claim 6, wherein the controller is configured to:
   count the quantity of erase pulses used to place the group of memory cells of the array in an erased state;
   identify a range of program/erase processing cycle quantity corresponding to the quantity of erase pulses; and
   adjust a number of operating parameters associated with the range.

9. The memory device of claim 8, wherein the range is not retained in memory as the group of memory cells is placed in an erased state.

* * * * *